US009698080B2

(12) United States Patent
Chiou et al.

(10) Patent No.: US 9,698,080 B2
(45) Date of Patent: Jul. 4, 2017

(54) CONDUCTOR STRUCTURE FOR THREE-DIMENSIONAL SEMICONDUCTOR DEVICE

(71) Applicant: Taiwan Semiconductor Manufacturing Company, Ltd., Hsin-Chu (TW)

(72) Inventors: Wen-Chih Chiou, Zhunan Township (TW); David Ding-Chung Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/846,561

(22) Filed: Sep. 4, 2015

(65) Prior Publication Data
US 2015/0380341 A1    Dec. 31, 2015

Related U.S. Application Data

(63) Continuation of application No. 13/417,917, filed on Mar. 12, 2012, now Pat. No. 9,130,024, which is a
(Continued)

(51) Int. Cl.
H01L 23/48 (2006.01)
H01L 21/768 (2006.01)
(Continued)

(52) U.S. Cl.
CPC ...... *H01L 23/481* (2013.01); *H01L 21/30604* (2013.01); *H01L 21/76898* (2013.01);
(Continued)

(58) Field of Classification Search
None
See application file for complete search history.

(56) References Cited

U.S. PATENT DOCUMENTS 5,786,238 A    7/1998  Pai et al.
6,100,475 A    8/2000  Degani et al.
(Continued)

OTHER PUBLICATIONS

Liu, C.C., et al., "Mapping System-on-Chip Designs from 2-D to 3-D ICs," Circuit and Systems, IEEE 2005 vol. 3, May 23-26, 2005, pp. 2939-2942.

*Primary Examiner* — Cory Eskridge
(74) *Attorney, Agent, or Firm* — Slater Matsil, LLP

(57) ABSTRACT

A three-dimensional semiconductor device using redundant bonding-conductor structures to make inter-level electrical connections between multiple semiconductor chips is disclosed. A first chip, or other semiconductor substrate, forms a first active area on its upper surface, and a second chip or other semiconductor substrate forms a second active area on its upper surface. According to the present invention, when the second chip has been mounted above the first chip, either face-up or face-down, the first active area is coupled to the second active area by at least one redundant bonding-conductor structure. In one embodiment, each redundant bonding-conductor structure includes at least one via portion that extends completely through the second chip to perform this function. In another, the redundant bonding-conductor structure extends downward to the top level interconnect. The present invention also includes a method for making such a device.

20 Claims, 8 Drawing Sheets

Related U.S. Application Data continuation of application No. 11/788,974, filed on Apr. 23, 2007, now Pat. No. 8,134,235.

(51) Int. Cl.
  *H01L 25/065* (2006.01)
  *H01L 25/00* (2006.01)
  *H01L 21/306* (2006.01)
  *H01L 23/00* (2006.01)

(52) U.S. Cl.
  CPC .............. *H01L 24/03* (2013.01); *H01L 24/09* (2013.01); *H01L 24/89* (2013.01); *H01L 25/0657* (2013.01); *H01L 25/50* (2013.01); *H01L 24/48* (2013.01); *H01L 2224/031* (2013.01); *H01L 2224/0331* (2013.01); *H01L 2224/0355* (2013.01); *H01L 2224/05553* (2013.01); *H01L 2224/08113* (2013.01); *H01L 2224/08135* (2013.01); *H01L 2224/48091* (2013.01); *H01L 2225/06513* (2013.01); *H01L 2225/06524* (2013.01); *H01L 2225/06527* (2013.01); *H01L 2225/06541* (2013.01); *H01L 2225/06544* (2013.01); *H01L 2225/06548* (2013.01); *H01L 2924/00014* (2013.01); *H01L 2924/14* (2013.01)

(56) References Cited

U.S. PATENT DOCUMENTS

| | | | |
|---|---|---|---|
| 6,531,384 | B1 | 3/2003 | Kobayashi et al. |
| 6,838,774 | B2 * | 1/2005 | Patti .................. H01L 21/76898 257/737 |
| 7,042,100 | B2 | 5/2006 | Yamamoto et al. |
| 7,265,441 | B2 | 9/2007 | Reiss et al. |
| 7,323,785 | B2 | 1/2008 | Uchiyama |
| 7,964,971 | B2 | 6/2011 | Farnworth |
| 8,134,235 | B2 | 3/2012 | Chiou et al. |
| 2002/0003307 | A1 | 1/2002 | Suga |
| 2002/0047218 | A1 | 4/2002 | Liu et al. |
| 2002/0117756 | A1 | 8/2002 | Yamashita |
| 2003/0062625 | A1 | 4/2003 | Anand |
| 2004/0188696 | A1 | 9/2004 | Chen et al. |
| 2005/0001326 | A1 | 1/2005 | Masuda |
| 2005/0127529 | A1 | 6/2005 | Huang et al. |
| 2006/0043535 | A1 | 3/2006 | Hiatt |
| 2006/0076664 | A1 | 4/2006 | Chen et al. |
| 2006/0202347 | A1 | 9/2006 | Egawa |
| 2006/0220182 | A1 | 10/2006 | Uchiyama |
| 2007/0057358 | A1 | 3/2007 | Satou et al. |
| 2007/0126005 | A1 | 6/2007 | Baek et al. |
| 2007/0166997 | A1 | 7/2007 | Knorr |
| 2007/0170584 | A1 | 7/2007 | Chatterjee |
| 2008/0006938 | A1 | 1/2008 | Patti et al. |
| 2009/0160050 | A1 | 6/2009 | Miyakawa et al. |
| 2010/0096760 | A1 | 4/2010 | Yu et al. |

\* cited by examiner

CONDUCTOR STRUCTURE FOR THREE-DIMENSIONAL SEMICONDUCTOR DEVICE

This application is a continuation of U.S. patent application Ser. No. 13/417,917, filed Mar. 12, 2012, entitled "Three-Dimensional Semiconductor Device," which is a continuation of U.S. patent application Ser. No. 11/788,974, filed on Apr. 23, 2007, entitled "Three-Dimensional Semiconductor Device," which applications are hereby incorporated herein by reference in their entireties.

BACKGROUND

Semiconductor devices are, generally speaking, small electronic apparatus that are capable of storing and manipulating information in the form of electrical signals. Coupled with input and output mechanisms and a power source, these devices are used in the manufacture of many different kinds of electronic appliances such as personal computers, cellular telephones, personal digital assistants, and gaming devices. Consumer appliances such as these have become very popular, and their popularity has helped support technological advances that have lowered their cost and increased their performance and reliability. Small, portable appliances are especially popular, and the market demand for even smaller and more energy-efficient devices is a constant driver in the industry. The drive to make smaller and smaller semiconductor devices, however, poses many challenges for chip manufacturers.

Semiconductor devices are made by fabricating thousands of very small electrical components on a substrate made of semiconductor material, such as doped silicon. The components, such as transistors, capacitors, resisters, and diodes, are formed by selective deposition and removal of successive layers of conducting, insulating, and semiconductor material. These components are also interconnected by conductive structures in similar fashion to form the integrated circuits that are operable to perform the various functions required of the device. Note that the term 'device' is herein used generally to designate all, or a portion of, or sometimes more than one functional apparatus; the specific device being described in any particular embodiment, however, should be apparent from the context.

For example, a semiconductor chip is a small, typically square or rectangular piece of silicon or other suitable substrate material upon which one or more integrated circuits has been formed. When fabrication of these devices is complete, the chip is encapsulated in the familiar black plastic material, or some other suitable means of protection, and may be found mounted to the circuit boards inside most modern electronic appliances. The package protects the chip mechanically and electrically, and provides leads or conductive bumps or some other means of establishing an external connection with the integrated circuits formed on the chip.

To make their manufacture more efficient, chips are not typically fabricated one at a time. Rather, a large number of them are fabricated together on a substrate frequently known as a wafer. A wafer is a typically round, flat piece of semiconductor material that has been sliced from an ingot of silicon or some other suitable material. FIG. 1 is a plan view of a typical semiconductor wafer 10. Wafer 10 is populated with a large number of dice 12 that have been formed upon its surface 11 in the manner generally described above. The fabrication process is often automated and depends on very precise positioning of the wafer, so an orientation notch 13 is formed on the periphery of wafer 10. Other means of precision positioning may of course be used as well. The dice 14, 15, and 16 are individually referred to for purposes of illustration; though in many cases they and all of the other dice on the surface 11 of wafer 10 are identically constructed. When fabrication is complete, or largely so, each die is separated from those adjacent to it in a process known as dicing, or singulation. Each separated die may also be referred to as a chip, though the terms are often interchangeable.

One such chip is shown in more detail in FIG. 2. FIG. 2 is a perspective view of an exemplary chip 16. The integrated circuits formed on the chip 16 are not individually shown, but are instead referred to generally as active area 18. Active area 18 is surrounded by a seal ring 17, which helps to protected the components of active area 18 during the fabrication process and, especially, during singulation. A number of bond pads 20 are arrayed about active area 18 and are used for making connections to the different integrated circuits contained therein. As should be apparent, the bond pads 20 are relatively larger than the individual circuit components, which are very small and would otherwise be very difficult to connect to. The actual connection is generally made by interconnects or other conductive structures (not shown), often disposed on one or more layers beneath the surface 21. As mentioned above, once singulated, chips may be packaged for individual use.

More recently, however, it has also become common to place more than one chip in a single package. This may be used to assemble an SIP (system in package) product where each chip handles a different portion of the system's (or subsystem's) function, and reduced the need for mounting many different packages on the circuit board of an electronic appliance. When this is done, connections may be made between chips, that is, between the active areas on respective chips, in much the same fashion as the external connections are made. Bond wires or leads, for example, may be mounted to bond pads on two different chips, or to a separate enclosed device used solely for making connections. While SIPs and similar devices may offer considerable improvements in performance compared to systems contained in multiple packages and mounted on a circuit board, market demands are forcing manufacturers to seek out even more performance gains.

A 3D (three-dimensional) semiconductor device may offer such gains. In a 3D device, the separate chips to be packaged together are stacked one on top of the other in a configuration sometimes known as a SIC (stacked integrated circuit) package. One example of such a device is shown in FIG. 3. FIG. 3 is an elevation (side) view of an exemplary SIC 30. Note that FIG. 3 is not necessarily drawn to scale, and that only a portion of each of the separate components is shown. In this example, SIC 30 includes three chips 34, 36, and 38, which are mounted onto a base wafer 32. Inter-chip layers 33, 35, and 37 may include an adhesive or some other form of bonding mechanism. Base wafer 32 may be a functional device with its own active area or may simply be a device to interconnect the chips 34, 36, and 38. In this example, greatly simplified for clarity, three bond wires 39 are used to connect each of these chips to base wafer 32.

As should be apparent, the active areas formed on each chip are, in an 3D-SIC, much closer together than if the chips were mounted side by side, due to the relatively-thin vertical dimension of most chips. Designers may take further advantage of this by strategically laying out the various integrated circuits on each chip to even further reduce the distance between certain circuits that are to be interconnected. Situated in this manner, active areas may be coupled with each other through solid vertical structures called vias, which are narrow conductor-filled recesses formed in one of the chips, passing all of the way through to connect to a vertically-adjacent chip. An example of this is shown in FIG. 4.

FIG. 4 is a side view illustrating in cross-section an exemplary SIC 40. SIC 40, like SIC 30 shown in FIG. 3, includes multiple chips arranged in a 3D configuration. Chip 44 is mounted on base wafer 42 using an inter-chip layer 43, and chip 46 is mounted on chip 44 using an inter-chip layer 45. In SIC 40, however, the inter-chip electrical connections are made using vertical vias. Note that the term 'vertical' is used for convenience with reference to the orientation of SIC 40 in FIG. 4. In actual practice, the device will usually though not necessarily be fabricated largely while in this orientation, though the finished product need not remain oriented in any certain manner.

Returning to the example of FIG. 4, base wafer 42 has two contacts 51 and 52, which are externally-accessible conductors to which other devices may connect. There will normally be many more such structures, of course, in a typical SIC; only two are shown here for simplicity. These will be sometimes referred to as 'target contacts' to distinguish them from other features, though they may be used for multiple functions in an actual device. The target contacts 51 and 52 are presumably connected to active areas (not shown) formed on the surface of base wafer 42, or to other areas of interest. In many cases, the target contacts will be interconnects situated in a top metal layer of their respective device. In this SIC 40, target contacts 51 and 52 are coupled to, and usually bonded with, vias 64 and 65, respectively.

Vias 64 and 65 are actually conductor-filled vias, or narrow recesses, extending through chip 44. At their upper end, they connected to pads 74 and 75, respectively. Pads 74 and 75 are, in turn, connected to select integrated circuits (not shown) formed in an active area present on the upper surface of chip 44, or to other components or interconnect. Similarly, target contacts 53, 54, and 55 have been formed at the surface of chip 44 and are connected to integrated circuits formed there. When the SIC 40 is assembled, they are bonded with vias 61, 62, and 63 respectively. Vias 61, 62, and 63 meet, at their upper extremity, pads 71, 72, and 73. In this way, connections are made between active areas formed on different levels of the SIC 40. Note, however, that although no bond wires or leads are shown in FIG. 4, they may of course be used in addition to the vias for inter-chip connections.

As should be apparent, the use of a three-dimensional configuration can greatly increase device performance characteristics, in large part by decreasing the distance signals must travel from one portion of the device to another. It also tends to reduce the horizontal area occupied by the finished chip or allow more components to be fabricated on the same size device. This smaller area does come in exchange for increased vertical height, but in many applications this dimension is less of a factor. The advantages of the three-dimensional configuration are enhanced when conductor-filled vias are used to establish connections between one chip and another within the semiconductor device. Unfortunately, current design and fabrication techniques often result in relatively lower yields compared to conventional practice.

Needed, then, is a way to exploit the advantages of three-dimensional semiconductor devices while increasing yield in the fabrication process by establishing more reliable inter-chip connections. The present invention provides just such a solution.

BRIEF DESCRIPTION OF THE DRAWINGS

For a more complete understanding of the present invention, and the advantages thereof, reference is now made to the following descriptions taken in conjunction with the accompanying drawings, in which:

FIG. 5b is a plan view of the redundant bonding-conductor structure of FIG. 5a.

FIG. 6b is a plan view of the redundant bonding-conductor structure of FIG. 6a.

FIG. 7b is a plan view of the redundant bonding-conductor structure of FIG. 7a.

DETAILED DESCRIPTION OF ILLUSTRATIVE EMBODIMENTS

Figure 1:
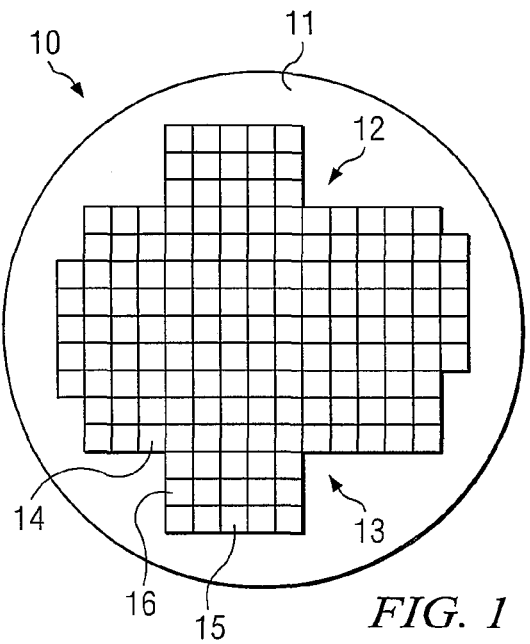
FIG. 1 is a plan view of a typical semiconductor wafer.
Figure 2:
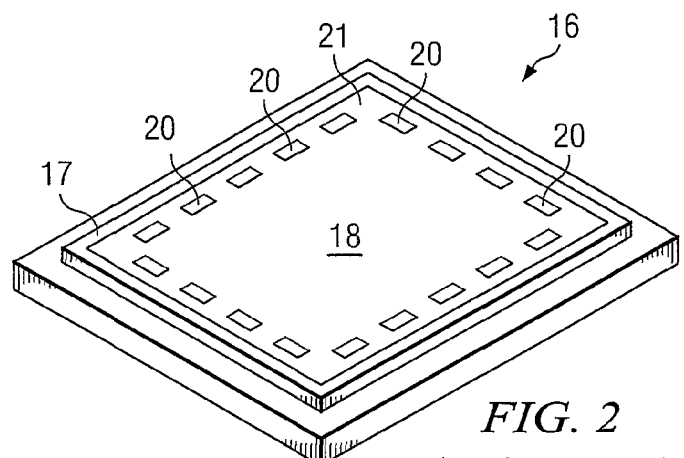
FIG. 2 is a perspective view of an exemplary chip.
Figure 3:
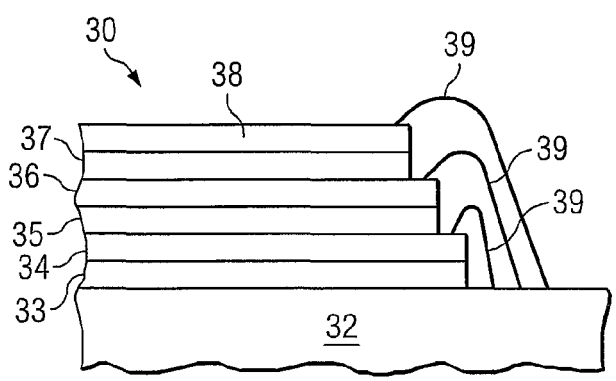
FIG. 3 is an elevation (side) view of an exemplary SIC.
Figure 4:
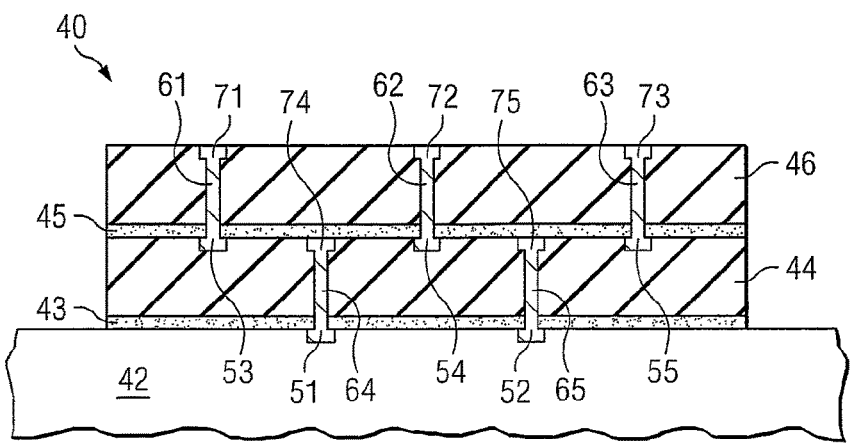
FIG. 4 is a side view illustrating in cross-section an exemplary SIC.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a 3D (three-dimensional) semiconductor device having two levels, that is, two chips or other substrata stacked one on top of the other. The invention may also be applied, however, to other semiconductor devices as well, including those with more than two layers.

The present invention, then, is directed to a reliable manner of coupling the components formed on one semiconductor chip with those formed on another, the two chips being disposed in a 3D stacked-IC (SIC) configuration. The use of conductor-filled vias is the preferred, though sometimes more difficult or less reliable option. Generally, though not necessarily, a each via will be filled with a conductor such as copper, which conductor will be electrically coupled at each end with devices formed on the same level, or with interconnects that are interconnected with active areas on the chip. In describing the present invention herein, note that a conductor-filled via will sometimes for convenience be referred to simply as a via.

Note also that there are basically two ways to assemble one chip with respect to another; face-up or face-down. In this regard the following convention will be observed herein. The main surface of a chip, on which active areas including a majority of the electrical components are formed, will be referred to as the face of the chip. The face of a chip is normally considered to be on its top surface, because generally speaking it is so oriented during much of the fabrication process. When describing two chips that are juxtaposed, such as in a 3D-SIC application, one of the chips may be considered to be normally oriented, that is face-up. Herein this chip will be referred to as the first chip and illustrated as being under any additional chips. The chip assembled above the first will be called the second, and may be bonded to the first in either a face-up or face-down orientation.

As should be apparent, the coupling of active areas on the two chips may vary depending on which orientation is chosen. The same of course applies to a third or any additional chips included in the stack. Embodiments of the present invention may be used to advantage in either case that is, for face-up or face-down bonding. Finally, note that while several of these embodiments will be described in terms of mounting one or more chips in a stacked relationship, each of these chips may be an individual unit, or part of a collection of chips, for example on a semiconductor wafer, that have not yet or may not ever be separated from each other.

To couple the active components of a first chip with those of a second when the second chip is in a face-up relationship, a via extends all of the way through the face-up chip to contact an appropriate area on the chip below. Frequently, such connections are made through multiple metal layers, each having strategically-placed interconnects. The second chip may be thinned to facilitate this type of bonding, although vias with high aspect ratios (that, is, long relative to their width) are usually still needed. When the second chip is in a face-down relationship with respect to the first, the via in the second chip need only reach down to the top metal layer. A high aspect ratio via is often still used, however, to conserve chip area. The via needed to couple the active areas on additional chips with those below will naturally depend on the orientation of both adjacent chips with respect to each other.

Figure 5A:
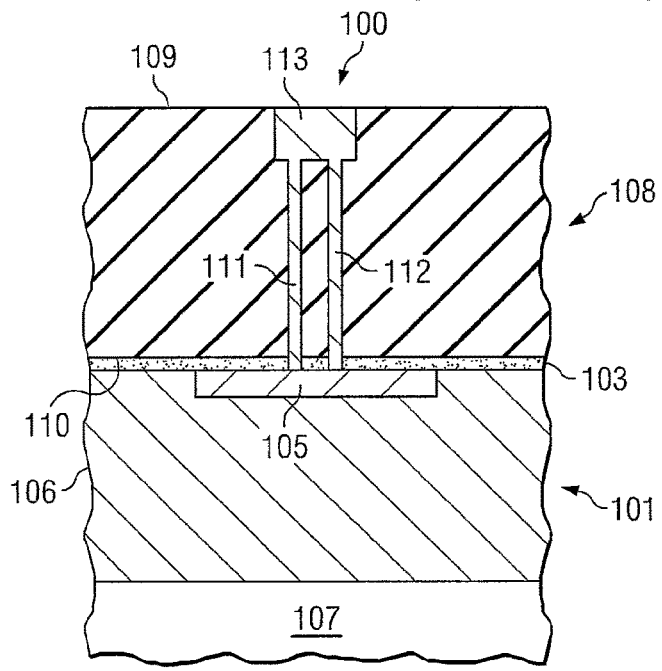
FIG. 5a is a side view illustrating in cross-section redundant bonding-conductor structure according to an embodiment of the present invention.
Figure 5B:
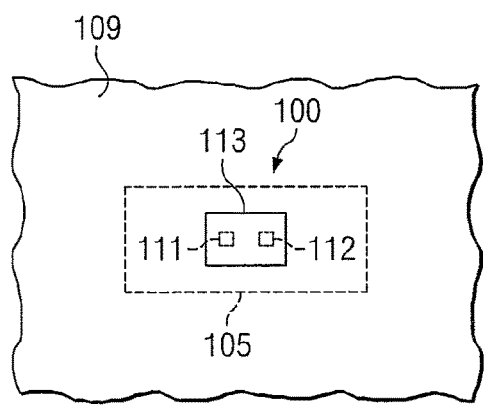

In accordance embodiments of the present invention, the via structures extending though the chip and coupling components or active areas of the chip to one or more other chips include redundant conductive-bonding features, and are therefore referred to as redundant bonding-conductor structures. Redundant bonding-conductor structures may also be employed as an externally-accessible connection with one or more top-level interconnects on a particular device, and include pad structure to bond to the externally-accessible features of another device, which may be redundant bonding-conductor structures as well. Several embodiments of the present invention will now be described. FIG. 5a is an elevation (side) view illustrating in cross-section a redundant bonding-conductor structure 100 according to an embodiment of the present invention. FIG. 5b is a plan view of the redundant bonding-conductor structure 100 of FIG. 5a. As can be seen in FIGS. 5a and 5b, a target conductor 105 is formed at or near the surface of first semiconductor chip 101. Target conductor 105 may, for example, be a portion of an interconnect or another similar structure, and is usually connected to one or more active areas (not shown) formed on substrate 107. This connection is often made through a series of interconnects (also not shown) found in metal layer region 106 of first semiconductor chip 101. Target conductor 105 has been formed for the purpose of coupling these active areas with components (also not shown) on a second conductor chip 108, though target conductor 105 may perform other functions as well.

In the embodiment of FIGS. 5a and 5b, redundant bonding-conductor structure 100 includes a via 111 and a via 112. Vias 111 and 112 are filled with a conductive material and extend from pad 113 to the lower surface 110 of chip 108, where they contact, and preferable bond with target contact 105. Second chip 108 itself is bonded to first chip 101 using a bonding material 103. Pad 113, as can be seen in FIG. 5b) forms a far broader surface than either of the vias 111 and 112, or even of both of them in combination. It is therefore more suited for bonding with a similar structure on a third semiconductor chip (not shown in FIG. 5a) when the third semiconductor chip is mounted on upper surface 109 (or on a bonding layer applied thereto). Note that while in this embodiment, the upper surface of pad 113 is co-planar with the upper surface 109 of second chip 108, in other embodiments it may protrude slightly to facilitate contact and bonding with another structure. In this embodiment, the conductor filling vias 111 and 112 does protrude slightly beyond the lower surface 110 of second chip 108 and extends through the bonding material 103 to target contact 105. This may be accomplished when the pad 113 is formed, or may be subsequently achieved by etching back the upper surface 109 of second chip 108.

Figure 10:
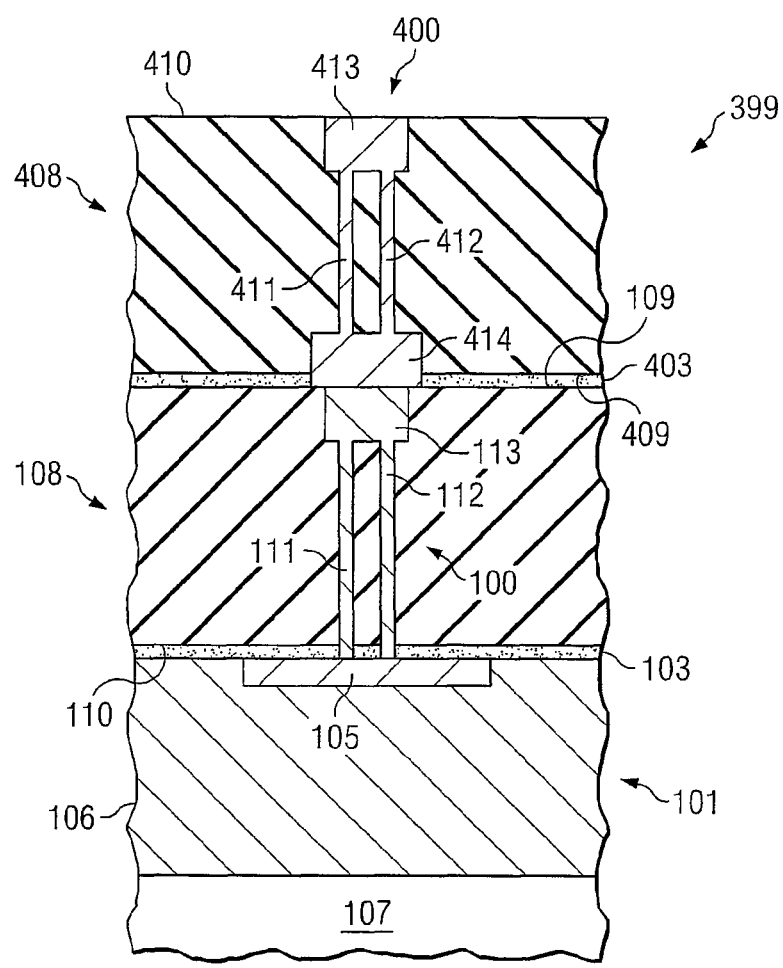
FIG. 10 is a side view illustrating in cross-section a semiconductor device having a redundant bonding-conductor structure according to an embodiment of the present invention.

In this embodiment, pad 113 may, of course, also be connected to components on the second semiconductor chip 108 itself. The redundant bonding-conductor structure 100 is therefore of advantage in bonding second semiconductor chip in a face-up orientation to first semiconductor chip 101, and in bonding second semiconductor chip to a third semiconductor chip (not shown in FIG. 5a) that is in a face-down configuration. An example of this is shown is shown in FIG. 10. FIG. 10 is a side view illustrating in cross-section a semiconductor device 399 using a redundant bonding-conductor structure, according to an embodiment of the present invention. Semiconductor device 399 includes the first semiconductor chip 101 and the second semiconductor chip 108 shown in FIG. 5a. In addition a third semiconductor chip 408 is now bonded to the second semiconductor chip 108 using bonding material 403. Third semiconductor chip 408 has a face, that is, a top side 409 and a bottom side 410, although as can be seen in FIG. 10 the chip 408 has been inverted prior to bonding. Third semiconductor chip 408 includes a redundant bonding-conductor structure 400.

In the embodiment of FIG. 10, redundant bonding-conductor structure 400 includes via 411 and via 412, which extend from bottom pad 413, formed at the bottom side 410 of chip 408, to top pad 414 formed on the opposing side. As can be seen in FIG. 10, top pad 414 and pad 113 of second semiconductor chip 108 both protrude slightly from the bonding surfaces of their respective chips to enhance the contact between them. Note that FIG. 10, as with the other drawings in this disclosure, is not necessarily drawn to scale, and that the relative shape and size of the individual components may vary. And although redundant bonding-conductor structures 100 and 400 lie along roughly the same axis and connect with each other, this is not necessarily the case. In addition, other redundant bonding-conductor structures may be used; a number of alternate embodiments will now be described.

Figure 6A:
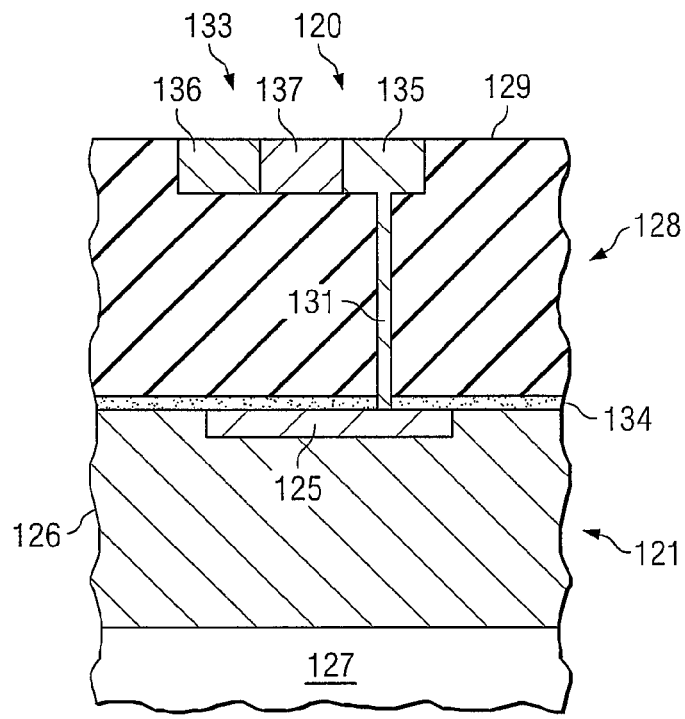
FIG. 6a is a side view illustrating in cross-section redundant bonding-conductor structure according to an embodiment of the present invention.
Figure 6B:
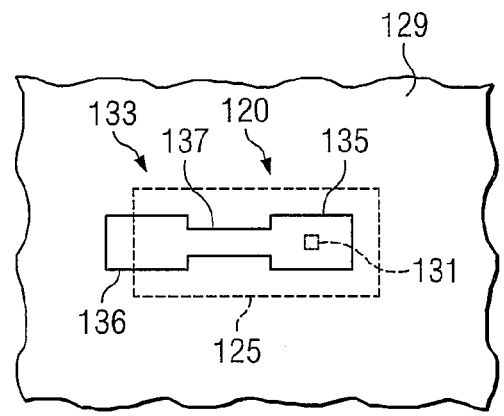

FIG. 6a is an elevation (side) view illustrating in cross-section a redundant bonding-conductor structure 120 according to another embodiment of the present invention. FIG. 6b is a plan view of the redundant bonding-conductor structure 120 of FIG. 6a. In this embodiment, redundant bonding-conductor structure 120 includes a pad structure having two pads, pad 135 and pad 136. Pad 136 is formed at the upper end of via 131, which extends vertically downward through second chip 128 to contact target contact 125 on first chip 121. First chip 121 and second chip 128 are bonded together at bonding layer 134. Pads 135 and 136 are connected physically and electrically by pad connector 137. Note that although pad 135 and pad 136 are co-planar at their upper and lower boundaries, and are about the same size, this uniformity may not be present in other embodiments. Target contact 125 is formed in a metal layer region 126 of first chip 121, which is in turn disposed above a substrate 127. Active areas (not shown) formed on substrate 127 are usually connected to target contact 125 through a series of interconnects (also not shown) formed in metal-layer region 126. As should be apparent, a third semiconductor chip (not shown) may also be added above second chip 128 of this embodiment, similar to third chip 408 shown in FIG. 10.

Figure 7A:
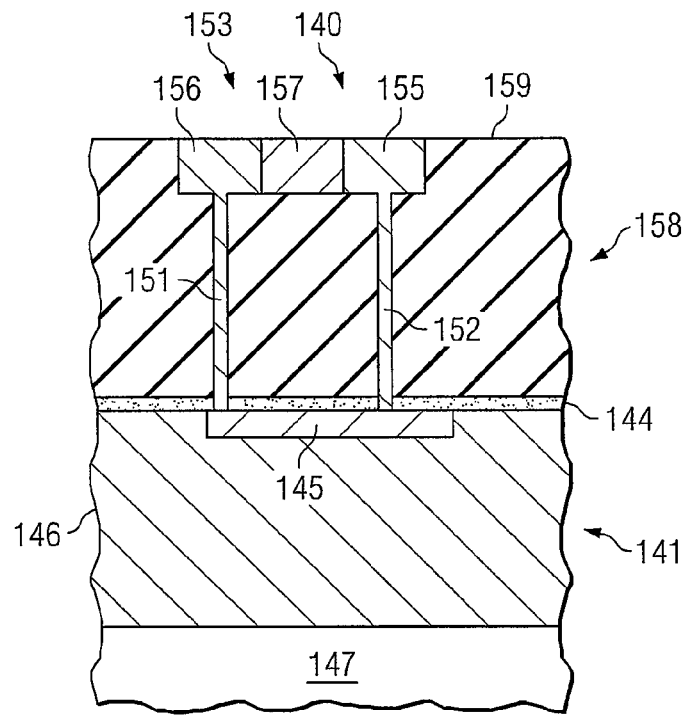
FIG. 7a is a side view illustrating in cross-section redundant bonding-conductor structure according to an embodiment of the present invention.
Figure 7B:
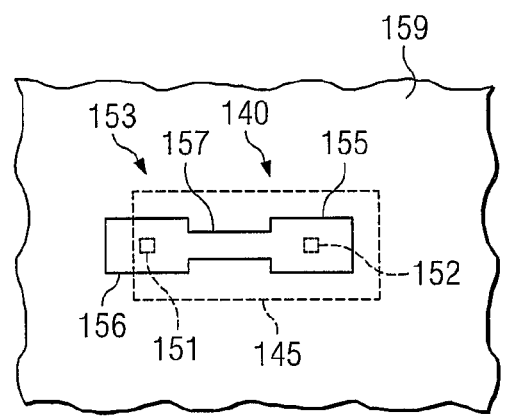

FIG. 7a is an elevation (side) view illustrating in cross-section redundant bonding-conductor structure 140 according to yet another embodiment of the present invention. FIG. 7b is a plan view of the redundant bonding-conductor structure 150 of FIG. 7a. In this embodiment, the advantages of the two embodiments presented above are combined. Redundant bonding-conductor structure 140 is formed in and extends vertically downward through a second chip 158. Redundant bonding-conductor structure 140 includes via 151, which extends downward from pad 156, and via 152, which extends downward from pad 155. Pads 155 and 156 are connected by pad connector 157, forming pad structure 153. Note that in an alternate embodiment (not shown); the pad connector 157 is not present to connect the redundant pads 155 and 156. The vias 151 and 152 extend downward to target contact 145, which is formed at the top of metal-layer region 146 of first chip 141. In most cases, target contact 145 is coupled to active areas (not shown) formed on the surface of semiconductor substrate 147.

Figure 8A:
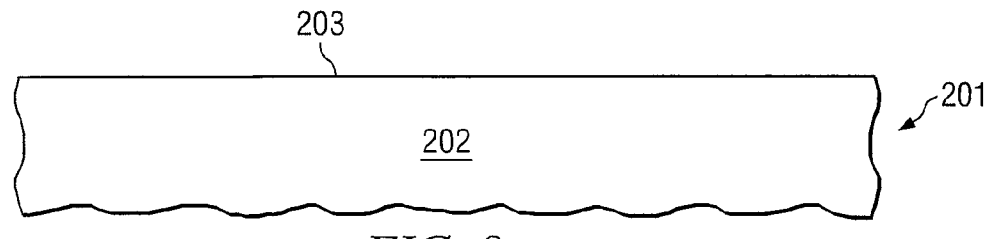
FIGS. 8a through 8h are a sequence of side views illustrating in cross-section a semiconductor device at various selected stages of fabrication according to an embodiment of the present invention.
Figure 8B:
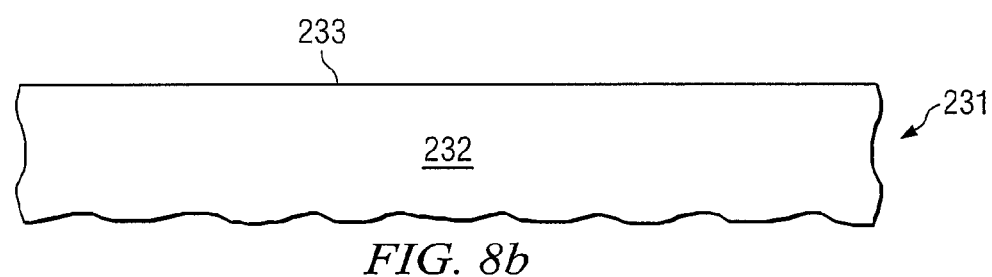

FIGS. 8a through 8h are a sequence of side views illustrating in cross-section a semiconductor device 200 at various selected stages of fabrication according to another embodiment of the present invention. FIG. 8a illustrates a base wafer portion 201. Base wafer portion 201 includes a semiconductor substrate 202, which has a surface 203 on which a number of active areas populated with integrated circuits (not shown) have been formed. The base wafer portion 201 is so-called because it will, in this embodiment, form the base for the completed device. Although shown here as the starting point, however, in some applications it may be formed later in the sequence. FIG. 8b illustrates a secondary wafer portion 231, again including a substrate 232 having a surface 233 on which a number of integrated circuits (also not shown) have been formed. Note that each of these wafer portions 201 and 231 may be a single chip, or they may include a number of dice that will be singulated into individual chips for packaging. As should be apparent, each of these wafer portions is a representative portion of an entire wafer, the remainder of which is not shown for simplicity. That is, the structures to be formed on the wafer portions depicted in FIGS. 8a through 8h are representative of those formed on the wafer portions that are not shown.

Figure 8C:
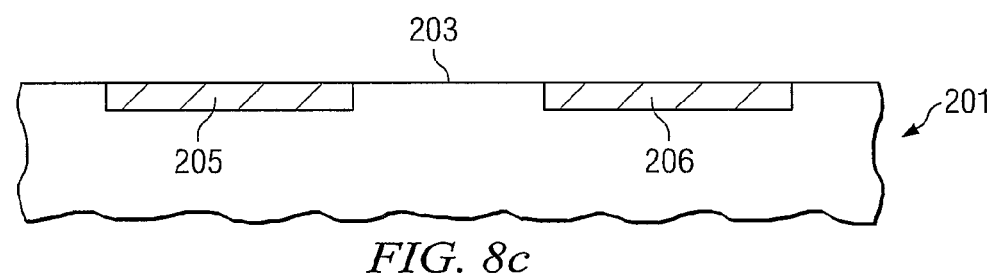

Target contacts 205 and 206 are then formed at the surface 203 of base wafer portion 201, as shown in FIG. 8c. These target contacts may be connected to one or more of the integrated circuits by other metal interconnects (also not shown) formed in one or more layers. For convenience, a collection of electronic components that have been formed on the surface of a semiconductor substrate will be generally referred to as an active area. No specific function, however, is thereby implied. The target contacts are simply conductive features accessible for making external connections. In some applications these contacts may be pads, in others a portion of an interconnect. Although for clarity only two are shown in FIG. 8c, in most applications there will be many more.

Specifically, target contacts 205 and 206 will be used in this embodiment to make an electrical connection with certain electronic components formed on secondary wafer 231, which may again generally be referred to as an active area. Note that the term secondary wafer is used for convenience, and because it, or at least portions of it, are to be positioned atop the base wafer 201. Note also that while the active areas formed on both wafers and to be coupled according to the present invention are referred to only generally, in an actual device the specific components to be connected in this fashion will be explicitly delineated. The exact function of the active areas to be coupled is simply not relevant to this disclosure.

Figure 8D:
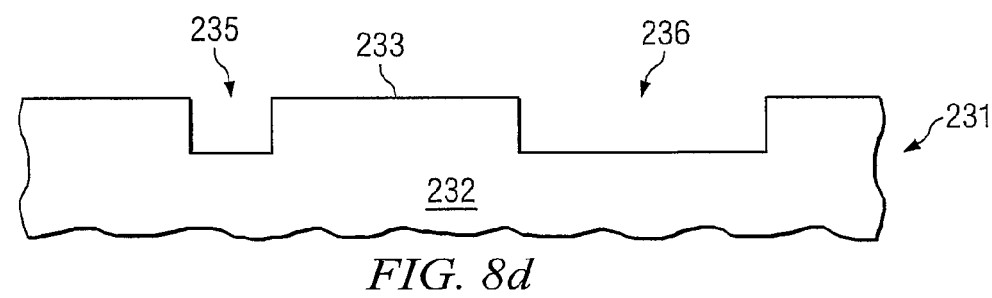
Figure 8E:
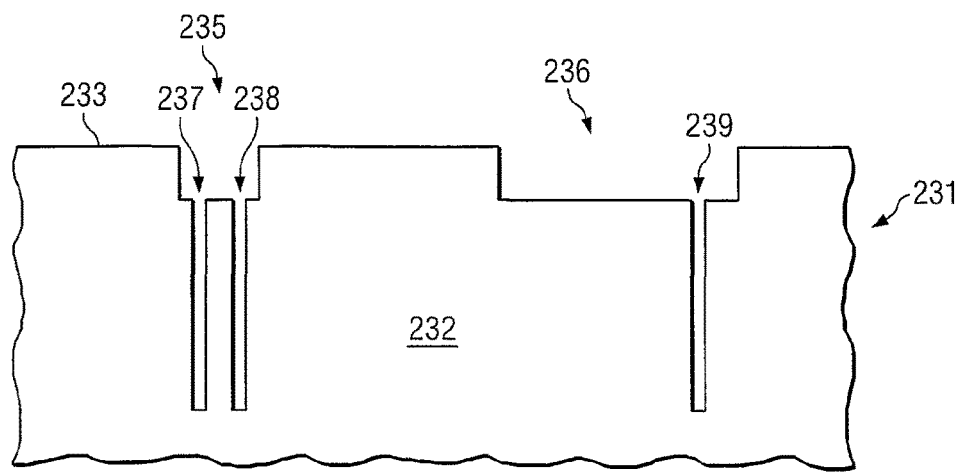

To connect the active area, however, additional structures must be formed. In this embodiment this is achieved by first forming one or more pad recesses, in this case pad recess 235 and pad recess 236, as shown in FIG. 8d. As should be apparent, pad recess 236 is somewhat more than twice the length of pad recess 235, and will be used to form somewhat different structures. This is further illustrated in FIG. 8e where the via recesses are visible. Formed in substrate 232 and extending downward from pad recess 235 are via recesses 237 and 238. Likewise, via 239 is formed in substrate 232 and extends downward from pad recess 236. In a preferred embodiment, the vertical length of the via recesses is greater than or equal to about five times their largest horizontal dimension. It should be noted that although in this embodiment the pad recesses were formed first, in an alternate embodiment (not shown) it may be done in reverse. That is, the narrower via recesses may be formed initially extending from the surface, with the pad recesses being formed later.

Figure 8F:
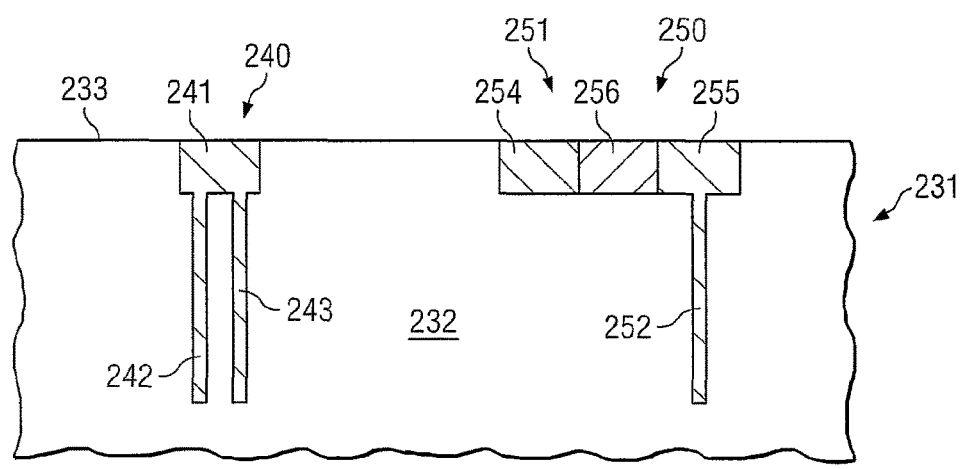

In either case, the conductive structures that are to connect the respective active areas may now be formed. To do this, a thin dielectric layer (not shown) is first formed, if necessary, to insulate the conductive material from the surrounding layers. The pad recesses and the via recesses are then filled with a conductive material, such as a metal or a metal alloy. Metals presently preferred for this purpose include copper (Cu), tungsten (W), and aluminum (Al), although other suitable materials may be used as well. In this embodiment, filling the recesses shown in FIG. 8e with conductive material results in the creation of two redundant bonding-conductor structures 245 and 246, as shown in FIG. 8f. Note that in FIG. 8f, the top surfaces of the redundant bonding-conductor structures 245 and 246 are co-planer with the surface 233 of the substrate 232. The deposition of the metal may actually include several addition operations, which are not separately shown. For example, a barrier later may first be deposited, followed by a seed layer and then the main body of conductive material. The recesses will typically be overfilled, with metal covering the entire surface 233. The excess metal is then removed, resulting in the configuration shown in FIG. 8f.

In the embodiment of FIGS. 8a through 8h, the redundant bonding-conductor structure 240 includes a pad 241 and two downwardly extending vias 242 and 243. This, of course, is similar to the configuration of redundant bonding-conductor structure 100 shown in FIG. 5a. Redundant bonding-conductor structure 250, on the other hand, has a pad structure 251 that includes pads 254 and 255, connected by a pad connector 256, with a single via 252 extending downward from pad 255. (In this context, it is noted that pad 241 may also be referred to as a pad structure having only a single pad.) The distinction between pad 254 and pad 255 may be more apparent by reference to the similar redundant conductive via structure 120 shown in FIGS. 6a and 6b. Redundant bonding-conductor structures 240 and 250 of FIGS. 8a through 8h therefore fulfill their function according to the present invention, albeit in somewhat different ways. Redundant bonding-conductor structure 240 ensures a reliable connection between an active area located on surface 233 of secondary wafer 231, while redundant bonding-conductor structure 246 ensures the reliability of a connection terminated at pads 242 and 243. And although not shown in FIGS. 8a through 8h, a redundant bonding-conductor structure according to the present invention could provide both advantages. A redundant bonding-conductor structure may include two pads and two vias, for example, as shown in FIGS. 7a and 7b. The number of pads and vias, however, is not limited to two, and more than two of either or both could be present.

Figure 8G:
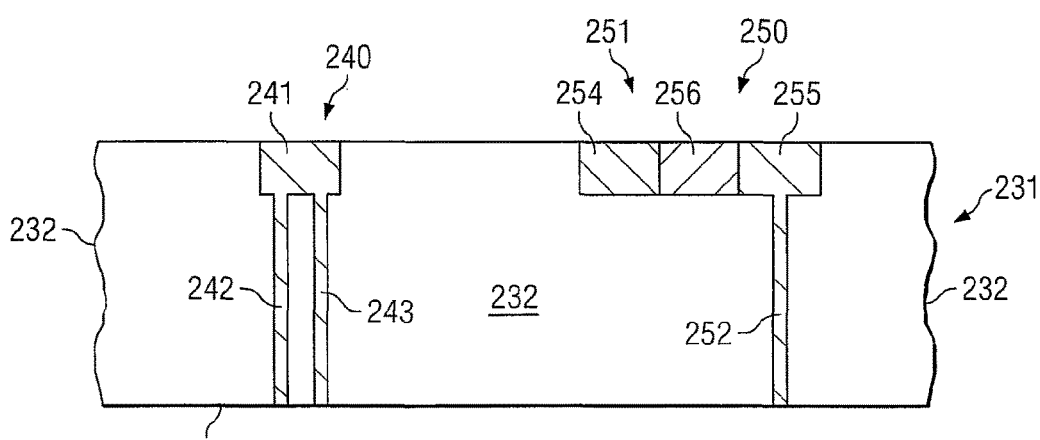
Figure 8H:
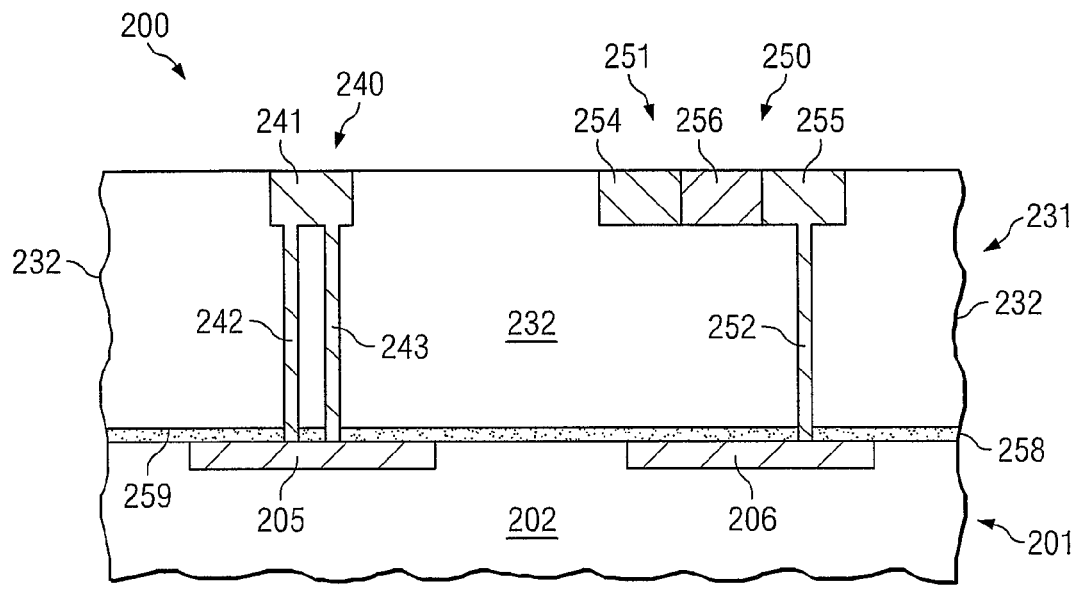

In this embodiment, the wafer portion 231 is then etched away from the bottom, thinning the wafer and exposing vias 242, 243, and 252, as shown in FIG. 8g. In a preferred embodiment, the new lower boundary 259 of wafer portion 231 is etched away further so that the lower end of each of the vias 242, 243, and 252 protrudes slightly beyond. The two wafer portions are now aligned and mounted together, forming semiconductor device 200. In this embodiment an adhesive compound 258 is deposited between them, usually prior to alignment and mounting. This configuration is shown in FIG. 8h. At this point, the fabrication process continues. This may include forming other components or adding additional wafers to the semiconductor device 200.

In another embodiment (not shown), the secondary wafer 231 may be inverted prior to alignment and mounting. In this case the redundant bonding-conductor structures may be used, for example, for coupling with another metal layer formed in the surface 259, or with another wafer portion there. In many embodiments, the base wafer will be singulated into individual devices for packaging after the mounting of one or more additional wafer portions. These additional wafer portions may be singulated in advance and, for example, mounted on a carrier for alignment with the base wafer.

Figure 9:
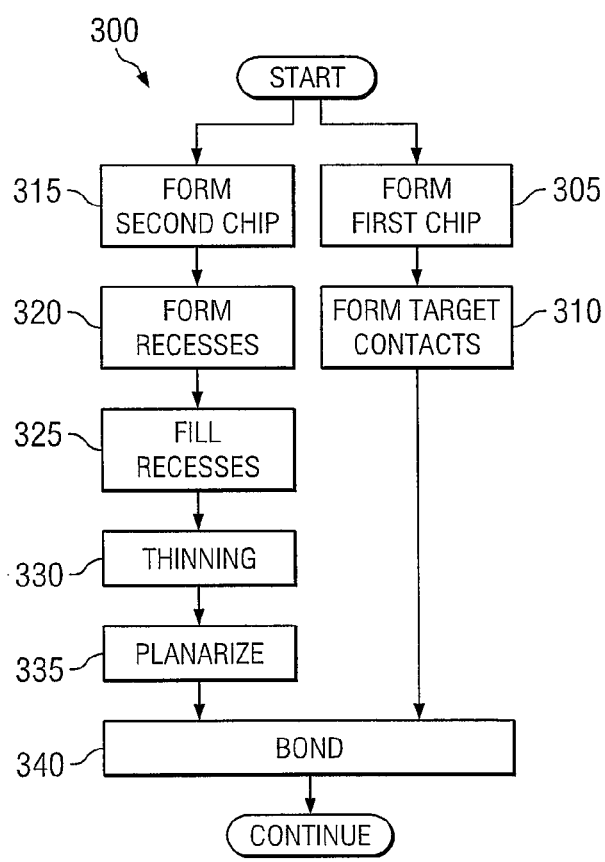
FIG. 9 is a flow diagram illustrating a method of fabricating a semiconductor device according to an embodiment of the present invention.

FIG. 9 is a flow diagram illustrating a method 300 of fabricating a semiconductor device according to an embodiment of the present invention. At START it is presumed that the materials and equipment necessary to performing the method are available and operational. The method then begins with forming at least one chip on a first semiconductor substrate (step 305). This operation normally includes the creation of the integrated circuits necessary for performing the chip's function, though the exact nature of the components formed is not relevant to describing the present invention. At least one target contact area in also formed on the chip (step 310), although there will typically be a number of such target contacts. Note that the target contact may be considered part of the first chip itself, and formed at the same time as the other chip components; it is referred to separately here simply for purposes of illustration.

A second chip is also formed (step 315), either at the same time as the first chip or at a different time. At least one, and usually a number of inter-chips via structure recesses are then formed (step 320). In this embodiment, this includes pad recesses and via recesses, with the inter-chip vias formed only part of the way thorough the second substrate in which they are being formed. Each inter-chip via recesses is in communication with a pad recess. Conductive material is now deposited to fill (step 325) each of the via and pad recesses. If necessary, a thin dielectric layer is first deposited to isolate the via structure conductor. Note that the recesses will normally be overfilled and the excess material removed, although these steps are not separately shown here. In some applications, the recess-filling operation may also include several separate operations, such as the formation of a barrier layer or a seed layer or both. These steps are likewise not separately shown.

In accordance with the embodiment of the present invention, at least one of the inter-chip via structures is a redundant bonding-conductor structure. This redundant bonding-conductor structure may, for example, include a plurality of vias associated with a single pad, a plurality of pads associated with a single via, or a plurality of vias in communication with a plurality of pads. An example of each of these alternatives is shown in the embodiments of FIGS. 5a through 7b, and an example of their application is shown in the embodiment of FIGS. 8a through 8h.

In the embodiment of FIG. 9, a thinning process is then performed (step 330) to thin the second chip and expose the conductor filled vias that were previously formed only part of the way through the substrate. This may be done, for example, by CMP (chemical mechanical polishing) or etching. Planarization (step 335) may then be needed to smooth the thinned surfaced of the substrate. The chip may then be aligned with the first semiconductor chip, and the exposed redundant conductive via structures bonded (step 340) with the target contacts.

The fabrication process may then continue until the stacked chip assembly is packages and installed in an electronic appliance (not shown). Of course, prior to that step an additional chip or chips may be installed onto the exiting two-chip assembly in similar fashion. Alternately, the upper level chips may be bonded together and then placed on the chip that is to serve as the base. Naturally, when the stacked chips have been bonded according to the present invention, external connections are provided before encasing the chip assembly.

Some problems are generally solved or circumvented, and technical advantages are generally achieved, by preferred embodiments of the present invention, which generally facilitates a yield improvement and provides for greater design flexibility in the fabrication of 3D-SIC semiconductor devices.

In accordance with a preferred embodiment of the present invention, a semiconductor device comprises a first active area formed on a first semiconductor substrate, a second area formed on a second semiconductor substrate, and at least one redundant bonding-conductor structure electrically coupling the first active area and the second active area. The redundant bonding-conductor structure may have multiple vias or multiple pads or both multiple pad and multiple vias. It may be used as an inter-level connector at the top metal layer, bonded with a conductive structure on an adjacent device, or the vias may extend all of the way through the substrate to connect with a target contact formed on the top metal layer of another substrate or to a metal layer formed on the reverse of the substrate through which the redundant bonding-conductor structure is formed. In a typical embodiment of the present invention, there will be a large number of redundant bonding-conductor structures employed at different levels and in different functions.

In accordance with another preferred embodiment of the present invention, a method for fabricating a semiconductor device comprises forming a first active area on a first semiconductor substrate, forming a second active area on a second semiconductor substrate, and forming a redundant bonding-conductor structure coupling the two. The method may further include forming a plurality of via recesses extending completely through the second semiconductor substrate, depositing a dielectric layer in the via recesses, and filling the recesses with a conductive material. A pad structure may also be formed at one end of each via, the pad structure having one or more pads.

Although the present invention and its advantages have been described in detail, it should be understood that various changes, substitutions and alterations can be made herein without departing from the spirit and scope of the invention as defined by the appended claims. For example, the different applications of redundant bonding-conductor structures presented above may be combined in a single device. As mentioned above, some 3D-SIC devices may have two layers, while others have three or more. In a multi-level device, the present invention may be applied with respect to each of the levels, or may be applied at only one; for example, where a higher layer requires few or even no coupling with a layer beneath it, use of redundant bonding-conductor structures may not be necessary. Bond wire connections may be used instead with respect to some of the levels, or may be used in addition to the redundant bonding-conductor structures.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
a first integrated circuit chip having a first exterior surface and a second exterior surface opposite from the first exterior surface, the first integrated circuit chip including a redundant conductor structure extending from the first exterior surface to the second exterior surface, the redundant conductor structure comprising more than one pad and/or more than one via, the redundant conductor structure comprising at least one pad and at least one via, wherein:
each pad of the redundant conductor structure is at the first exterior surface, and
each via of the redundant conductor structure extends from a respective pad of the redundant conductor structure to the second exterior surface.

2. The structure of claim 1 further comprising a second integrated circuit chip bonded to the second exterior surface of the first integrated circuit chip, each via of the redundant conductor structure contacting a conductive feature on the second integrated circuit chip.

3. The structure of claim 1 further comprising a second integrated circuit chip bonded to the first exterior surface of the first integrated circuit chip, each pad of the redundant conductor structure contacting a conductive feature on the second integrated circuit chip.

4. The structure of claim 1, wherein each via of the redundant conductor structure protrudes from the second exterior surface.

5. The structure of claim 1, wherein the redundant conductor structure comprises more than one pad.

6. The structure of claim 1, wherein the redundant conductor structure comprises more than one via.

7. The structure of claim 1, wherein the redundant conductor structure comprises more than one pad and more than one via.

8. The structure of claim 1, wherein the redundant conductor structure has two vias extending from one pad.

9. The structure of claim 1, wherein the redundant conductor structure has two pads connected together by a pad connector at the first exterior surface.

10. The structure of claim 1, wherein the redundant conductor structure has a first pad connected by a pad connector at the first exterior surface to a second pad, the redundant conductor structure further having a first via extending from the first pad and a second via extending from the second pad.

11. A structure comprising:
a first integrated circuit chip having a first exterior surface and a second exterior surface opposite from the first exterior surface, the first integrated circuit chip comprising:
a first pad at the first exterior surface,
a second pad at the first exterior surface,
a pad connector at the first exterior surface, the pad connector connecting the first pad to the second pad, and
a first via extending from the first pad to the second exterior surface;
wherein a virtual line that extends along a sidewall of the first pad and a sidewall of the second pad does not extend along a sidewall of the pad connector.

12. The structure of claim 11, wherein no via extends from the second pad in the first integrated circuit chip.

13. The structure of claim 11, wherein the first integrated circuit chip further comprises a second via extending from the second pad to the second exterior surface.

14. The structure of claim 11 further comprising a second integrated circuit chip bonded to the second exterior surface of the first integrated circuit chip, the first via contacting a conductive feature on the second integrated circuit chip.

15. The structure of claim 11 further comprising a second integrated circuit chip bonded to the first exterior surface of the first integrated circuit chip, the first pad and the second pad contacting a conductive feature on the second integrated circuit chip.

16. The structure of claim 11, wherein the first via protrudes from the second exterior surface.

17. A structure comprising:
a first integrated circuit chip having a first exterior surface and a second exterior surface opposite from the first exterior surface, the first integrated circuit chip comprising:

a first pad at the first exterior surface,
a second pad at the first exterior surface,
a first via extending from the first pad to the second exterior surface;
a second via extending from the second pad to the second exterior surface; and
a second integrated circuit chip having a third exterior surface, the second integrated circuit chip comprising a third pad at the third exterior surface, wherein the first via and the second via are coupled to the third pad.

18. The structure according to claim 17, further comprising a pad connector at the first exterior surface of the first integrated circuit chip, the pad connector connecting the first pad to the second pad.

19. The structure according to claim 17, further comprising a bonding material disposed between the first integrated circuit chip and the second integrated circuit chip.

20. The structure according to claim 17, wherein sidewalls of the first pad are within a lateral extend of the third pad in a plan view.

* * * * *